United States Patent
Maruyama (10) Patent No.: US 11,258,022 B2
(45) Date of Patent: Feb. 22, 2022

(54) MANUFACTURING METHOD OF DISPLAY DEVICE

(71) Applicant: Japan Display Inc., Tokyo (JP)

(72) Inventor: Satoshi Maruyama, Tokyo (JP)

(73) Assignee: Japan Display Inc., Tokyo (JP)

( * ) Notice: Subject to any disclaimer, the term of this patent is extended or adjusted under 35 U.S.C. 154(b) by 35 days.

(21) Appl. No.: 16/846,478

(22) Filed: Apr. 13, 2020

(65) Prior Publication Data

US 2020/0243782 A1 Jul. 30, 2020

Related U.S. Application Data

(63) Continuation of application No. PCT/JP2018/039202, filed on Oct. 22, 2018.

(30) Foreign Application Priority Data

Oct. 23, 2017 (JP) .............................. JP2017-204545

(51) Int. Cl.
| | | |
|---|---|---|
| H01L 51/00 | (2006.01) | |
| H01L 27/32 | (2006.01) | |
| H01L 51/52 | (2006.01) | |
| H01L 51/56 | (2006.01) | |

(52) U.S. Cl.
CPC ...... *H01L 51/0097* (2013.01); *H01L 27/3246* (2013.01); *H01L 27/3272* (2013.01); *H01L 27/3276* (2013.01); *H01L 51/003* (2013.01); *H01L 51/5253* (2013.01); *H01L 51/56* (2013.01); *H01L 2227/326* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 10,069,092 B2 | 9/2018 | Minami et al. | |
| 10,224,498 B2 * | 3/2019 | Um | H01L 51/5253 |
| 2016/0141551 A1 * | 5/2016 | Seo | H01L 51/5253 257/40 |
| 2017/0162825 A1 * | 6/2017 | Xiao | H01L 51/003 |
| 2017/0288007 A1 | 10/2017 | Shin et al. | |
| 2018/0123060 A1 * | 5/2018 | Jang | H01L 51/0097 |
| 2019/0372035 A1 * | 12/2019 | Yoshida | B32B 7/04 |
| 2020/0335725 A1 * | 10/2020 | Maruyama | G09F 9/30 |

OTHER PUBLICATIONS

Japanese Office Action dated Jun. 15, 2021 issued in Japanese Application No. 2017-204545, with English machine translation.
International Search Report (PCT/ISA/210) dated Dec. 18, 2018 for the PCT application No. PCT/JP2018/039202, with partial English machine translation.
English machine translation of Japanese Office Action dated Oct. 26, 2021, issued in Japanese Application No. 2017-204545.

* cited by examiner

*Primary Examiner* — J. E. Schoenholtz
(74) *Attorney, Agent, or Firm* — Michael Best & Friedrich LLP (57) ABSTRACT

A display device includes a flexible substrate, and a display region having a plurality of pixels on the flexible substrate. The substrate includes a resin layer, a first inorganic insulating layer provided on the first resin layer, and a second resin layer provided on the first insulating layer. A thickness of the second resin layer is larger than a thickness of the first resin layer, and the first resin layer is a resin layer baked at a higher baking temperature than the second resin layer.

7 Claims, 13 Drawing Sheets

MANUFACTURING METHOD OF DISPLAY DEVICE

CROSS REFERENCE TO RELATED APPLICATIONS

This application is based upon and claims the benefit of priority from the prior Japanese Patent Application No. 2017-204545 filed on Oct. 23, 2017, and PCT Application No. PCT/JP2018/039202 filed on Oct. 22, 2018, the entire contents of which are incorporated herein by reference.

FIELD

This disclosure relates to a display device and a manufacturing method of the display device. An embodiment of the present invention relates to a flexible display device formed using a flexible substrate and a manufacturing method of the flexible display device.

BACKGROUND

One examples of the display device include a Liquid Crystal Display Device and an organic electroluminescence (Electroluminescence; EL) display device. These display devices each include a liquid crystal element or an organic light emitting element (hereinafter, light emitting element) as a display element in each of a plurality of pixels formed on a substrate. A liquid crystal element or a light-emitting element has a layer (hereinafter, liquid crystal layer) containing a compound exhibiting liquid crystallinity or a layer (hereinafter, electroluminescent layer or EL layer) containing an organic compound exhibiting electroluminescence between a pair of electrodes. A liquid crystal element or a light emitting element is driven by applying a voltage or flowing a current between a pair of electrodes.

In the above-described display device, by using a flexible substrate as the substrate, flexibility can be imparted to the entire display device. Accordingly, a display device having a partially or wholly curved shape or a display device that can be freely deformed by a user is provided. Also in a display device of a normal form, a display device that narrows a frame by bending a substrate so that a region around a display region (hereinafter, also referred to as "peripheral region" or "frame region") is positioned on a rear side of the display region is disclosed. (for example, Japanese Laid-Open Patent Publication No. 2012-128006).

SUMMARY

A display device according to an embodiment of the present invention includes a flexible substrate, and a display region having a plurality of pixels on the flexible substrate, wherein the substrate includes a resin layer, a first inorganic insulating layer provided on the first resin layer, and a second resin layer provided on the first insulating layer, wherein a thickness of the second resin layer is larger than a thickness of the first resin layer, and the first resin layer is a resin layer baked at a higher baking temperature than the second resin layer.

A methods for manufacturing display device according to an embodiment of the present invention includes forming a substrate having a first resin layer, a first inorganic insulating layer provided on the first resin layer, and a second resin layer provided on the first inorganic insulating layer on a support substrate, forming a functional layer includes a thin film transistor, a third resin layer or a third inorganic insulating layer covering the thin film transistor, a pixel electrode provided on the third resin layer or the third inorganic insulating layer and electrically connected to the thin film transistor, a bank covering an end of the pixel electrode and exposing a part of the upper surface of the pixel electrode, an organic layer covering a part of the upper surface of the exposed pixel electrode, and a counter electrode covering the organic layer and the bank, forming a sealing layer covering the counter electrode, the sealing layer Including a fourth inorganic insulating layer, and peeling the support substrate from the substrate, the second resin layer is formed to have a thickness greater than a thickness of the first resin layer, performing a first heat treatment after forming the first resin layer and before forming the first inorganic insulating layer, performing a second heat treatment after forming the second resin layer. A maximum temperature during the second heat treatment is lower than a maximum temperature during the first heat treatment.

DESCRIPTION OF EMBODIMENTS

One object of an embodiment of the present invention to provide a highly reliable display device. For example, one object of an embodiment of the present invention to provide a display device capable of maintaining high reliability even when a substrate having a flexibility is bent or folded.

Hereinafter, an embodiments of the present invention will be described below with reference to the drawings and the like. However, the present invention can be carried out in various modes without departing from the gist of the technical idea, and is not be construed as being limited to the description of the embodiments exemplified below.

The drawings may be schematically represented in terms of width, thickness, shape, and the like of each part as compared with actual embodiments for the sake of clarity of description, but are merely examples, and the illustrated shape itself is not intended to limit the interpretation of the present invention. In addition, in the drawings, elements having the same functions as those described with reference to the drawings already described in the specification are denoted by the same reference numerals even in other drawings, and overlapping descriptions are omitted in some cases.

When a film is processed to form a plurality of structures, each structure may have a different function and role, and each structure may have a different base on which it is formed. However, these plural structures are derived from films formed as the same layer in the same process and have the same material. Therefore, a plurality of films is defined as being present in a same layer.

In expressing a mode of arranging another structure on a certain structure, the case of simply expressing "above" includes both the case of arranging another structure directly above a certain structure in contact with the structure and the case of arranging another structure above the certain structure through another structure, unless otherwise specified.

The phrase "one structure is exposed from another structure" means a region in which a portion of one structure is not covered by another structure. However, the expression "a structure is exposed from another structure" includes a case where a portion not covered by the other structure is covered by another structure.

First Embodiment

A structure of the display device according to an embodiment of the present invention will be described below.

Figure 1:
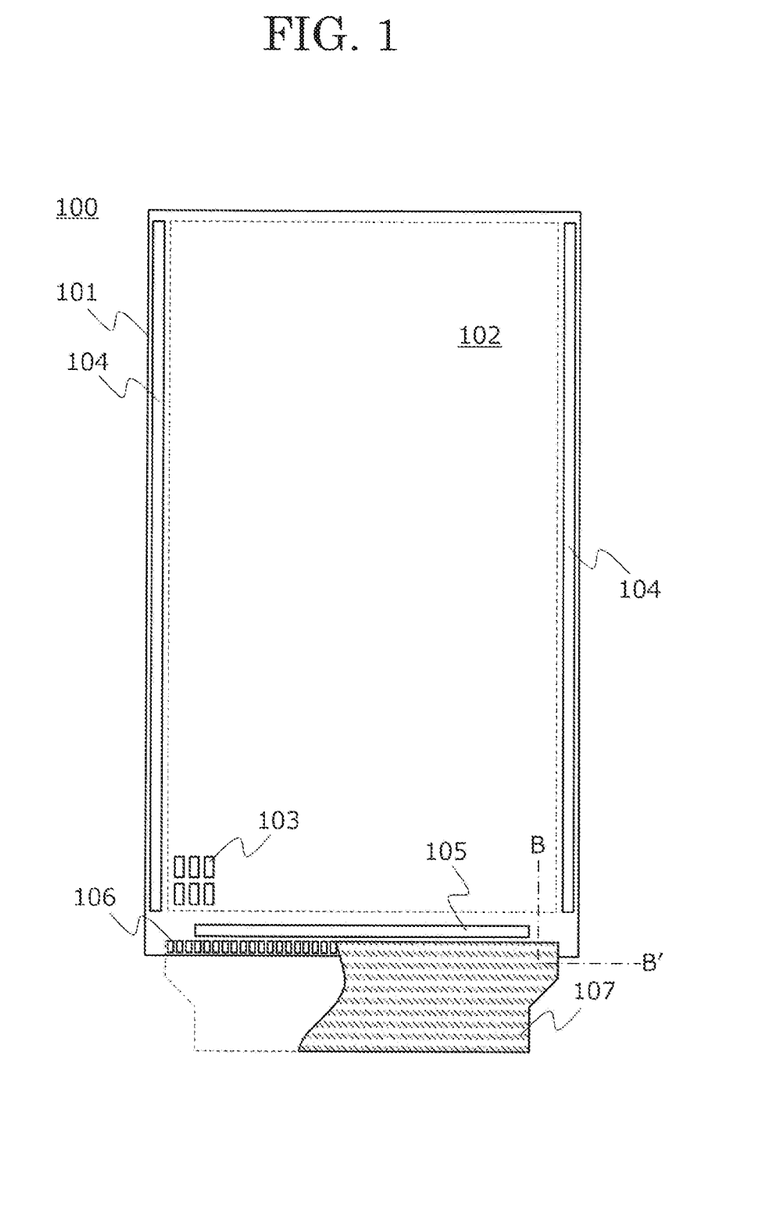
FIG. 1 is a top schematic view showing a display device according to an embodiment of the present invention.

FIG. 1 shows a schematic top view of a display device 100. The display device 100 includes a substrate 101, and on one surface of the substrate 101, various conductive layers, semiconductor layers, and insulating layers patterned into a desired shape are provided. A plurality of pixels 103 are formed using conductive layers, semiconductor layers, and insulating layers. A drive circuit (a gate drive circuit 104, a source drive circuit 105) for driving the plurality of pixels 103 may be formed on the substrate 101 simultaneously with the plurality of pixels 103 using the conductive layers, the semiconductor layers, and the insulating layers, or an IC may be mounted on one surface of the substrate 101. The plurality of pixels 103 is arranged, for example, in a matrix form, and a display region 102 is formed by a set of them.

The gate drive circuit 104 or the source drive circuit 105 is located on the outer peripheral region of the display region 102. Various wirings (not shown) formed of a patterned conductive layer extend from the display region 102, the gate driving circuit 104, and the source driving circuit 105 to one side of the substrate 101. Each wiring is electrically connected to a terminal 106 arranged near an end of the substrate 101. The terminals 106 are connected to a flexible printed circuit board (Flexible Printed Circuit: FPC) 107. When the driver circuit is provided by an IC, the driver circuit may be mounted on the FPC 107 instead of the substrate 101.

Video signals and various control signals are supplied via the FPC 107 from a controller (not shown) external to the display device. The video signals are processed by the source drive circuit 105 and input to the plurality of pixels 103. Various control signals are input to the gate drive circuit 104 and the source drive circuit 105.

In addition to the video signals and various control signals, a power is supplied to the display device 100 to drive the gate drive circuit 104, the source drive circuit 105, and the plurality of pixels 103. Each of the plurality of pixels 103 has the light-emitting element to be described later. A part of the power supplied to the display device 100 is supplied to the each light-emitting element of the plurality of pixels 103 to emit the light-emitting element.

Figure 2:
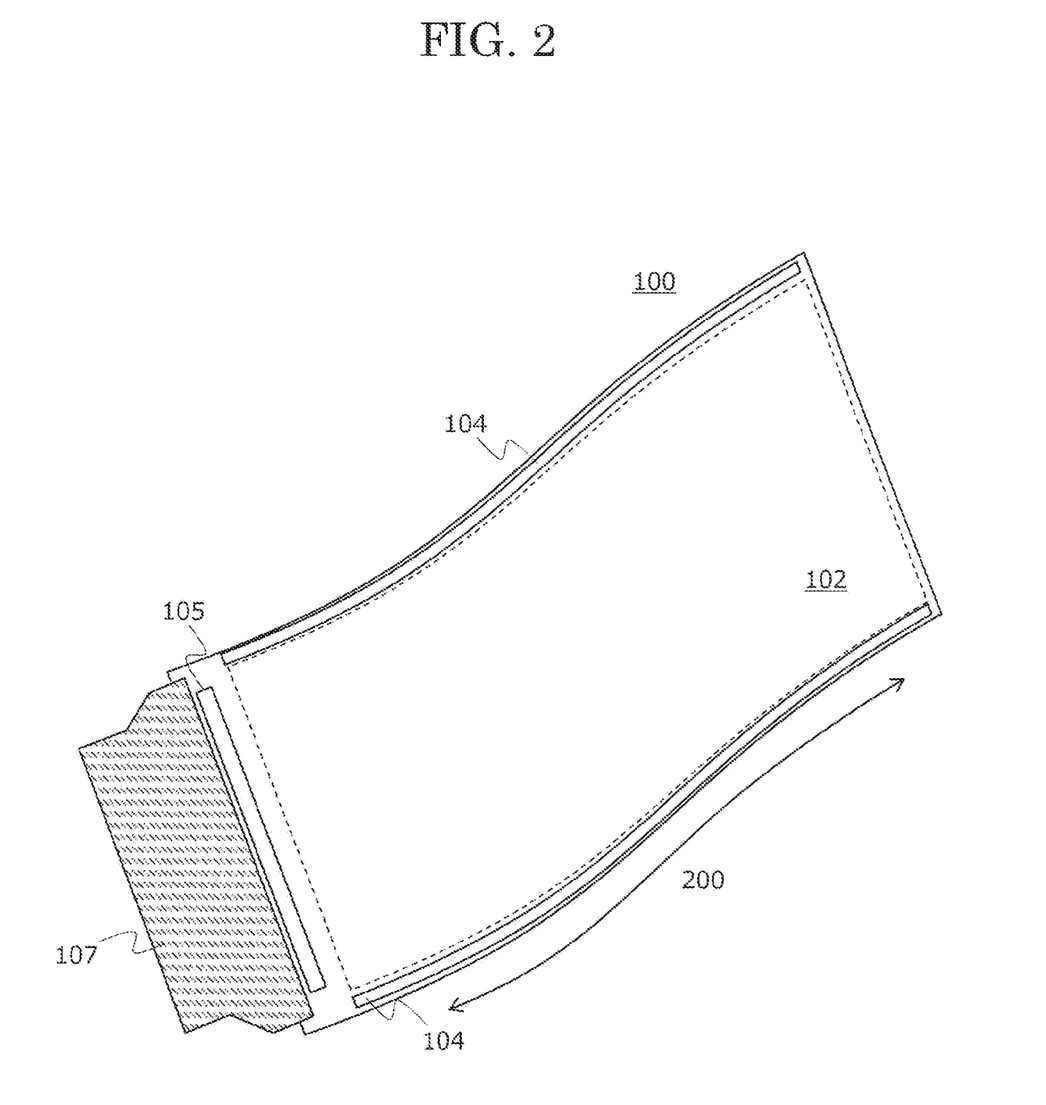
FIG. 2 is a planar view showing a display device according to an embodiment of the present invention.
Figure 3:
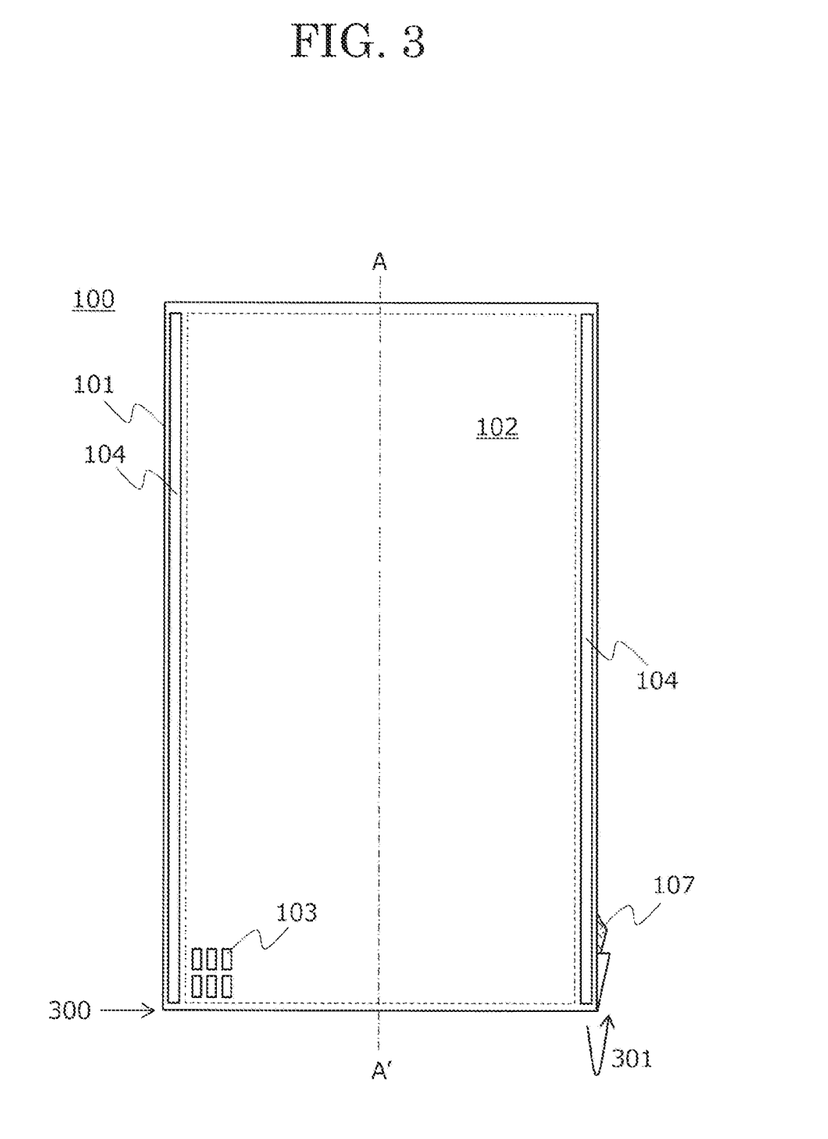
FIG. 3 is a planar view showing a display device according to an embodiment of the present invention.
Figure 4:
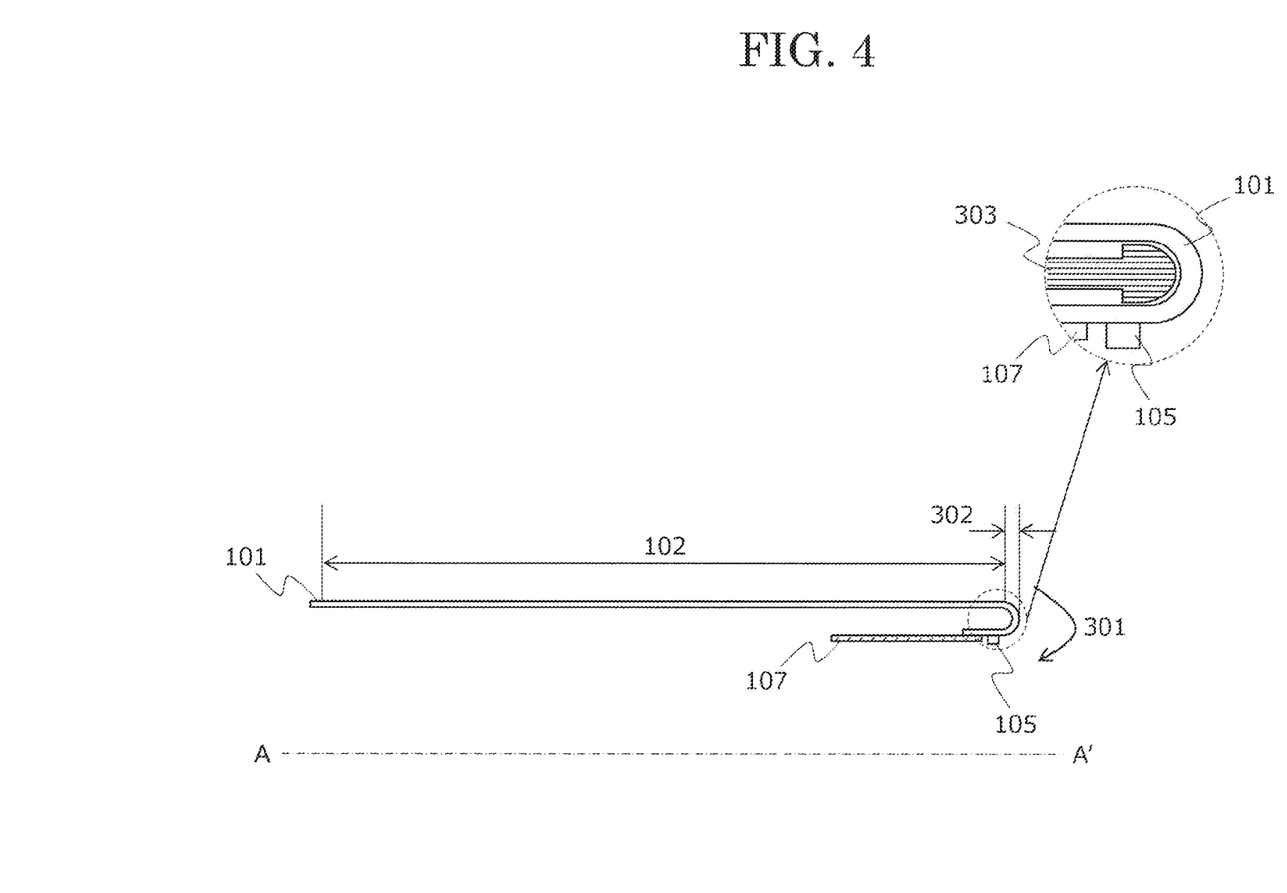
FIG. 4 is a cross-sectional view showing a display device according to an embodiment of the present invention.

By using the substrate having flexibility as the substrate 101, it is possible to impart flexibility to the display device 100 as shown in FIGS. 2 to 4. For example, as shown in FIG. 2, a bendable region 200 is provided over the entire display region 102. The display device can be applied to an electronic device having a highly designed design having a curved display surface, an electronic device capable of storing a display area in a roll shape, and the like. Further, as shown in FIGS. 3 and 4, the substrate 101 is bent in a direction of an arrow 301 in a foldable region 300 provided between the display region 102 and the FPC 107. The source drive circuit 105 and the FPC 107 are bent so as to overlap the rear surface of the display region 102. Thus, it is possible to realize a narrow picture frame of the display device 100. FIG. 4 shows a cross section taken along line A-A' in FIG. 3, and the substrate 101 is bent as shown by an arrow 301. The source drive circuit 105 and the FPC 107 are arranged so as to overlap on the rear surface side of the display region 102, and have a narrow frame as indicated by a width 302. Further, on the inside of the bent portion, a spacer 303 for holding the cross-sectional form of the substrate 101 may be provided.

Figure 5:
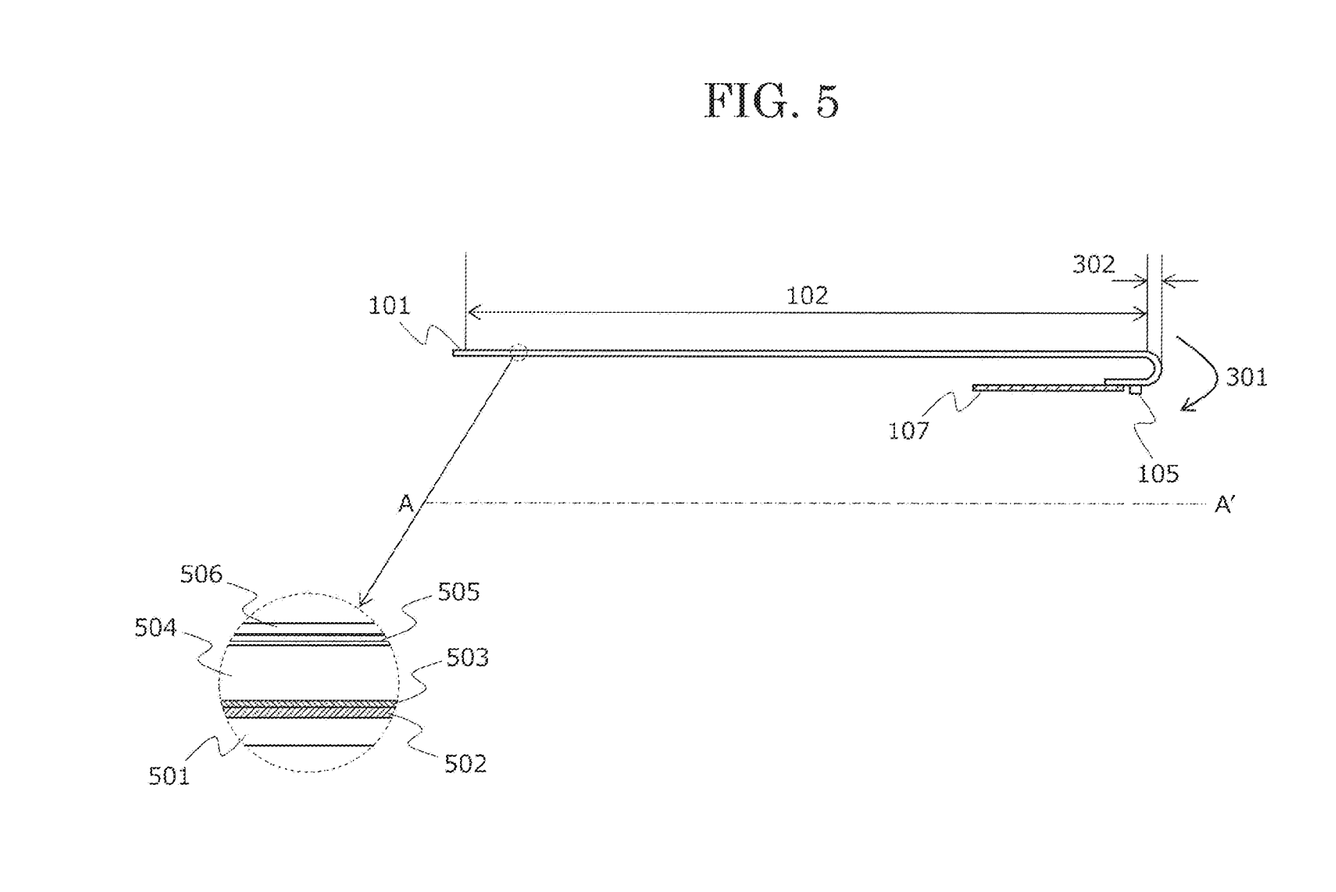
FIG. 5 is a cross-sectional view showing a display device according to an embodiment of the present invention.

FIG. 5 shows a cross-sectional structure of the display device 100 according to an embodiment of the present invention. As described above, the substrate 101 has a stacked structure including a first resin layer 501, a first inorganic insulating layer 502, a second inorganic insulating layer 503, and a second resin layer 504. As described above, the plurality of pixels formed using the conductive layer, the semiconductor layer, and the insulating layer, and a functional layer 505 including the gate drive circuit are formed over the substrate 101. A sealing layer 506 is formed over the functional layer 505.

The first resin layer 501 and the second resin layer 504 are formed as a layer including materials selected from acrylics, polyimides, polyethylene terephthalate, polyethylene naphthalate, and the like. The first inorganic insulating layer 502 has a function as a barrier film for preventing moisture or other contaminants from entering the functional layer 505 through the first resin layer 501 and the second resin layer 504, and is configured as a layer including a material selected from silicon nitride, silicon oxide, or silicon oxynitride. The second inorganic insulating layer 503 has a function of improving adhesion at the interface between the first inorganic insulating layer 502 and the second resin layer 504 and is formed as a layer containing amorphous silicon having good adhesion to both materials. The resin layer and the inorganic insulating layer differ in the stresses remaining in the film due to the differences in their materials and the process of forming them. As a result, the adhesion at the interface between the two is deteriorated. The deterioration in adhesion is particularly remarkable when a resin layer is formed on the surface on which the inorganic insulating layer is formed. In the example of FIG. 5, the second inorganic insulating layer 503 is provided between the first inorganic insulating layer 502 and the second resin layer 504. The second inorganic insulating layer 503 may be provided between the first resin layer 501 and the first inorganic insulating layer 502 for the same purpose, or may be omitted.

The film thickness of the substrate 101 is a thickness that achieves both flexibility which can be curved or bent as shown in FIGS. 2 to 4 and strength that does not cause breakage due to bending. The thickness of the substrate 101 may be, for example, 100 μm or less, preferably 50 μm or less, including the above-described laminated structure. More preferably, the thickness can be about 10 μm to 30 μm.

In the present embodiment, as shown in FIG. 5, the thickness of the first resin layer 501 is thinner than the thickness of the second resin layer 504. For example, the thickness of the first resin layer 501 is preferably 70% or less, preferably about 40% to 60% of the thickness of the second resin layer 504. Specifically, the thickness of the first resin layer 501 is about 50% of the thickness of the second resin layer 504.

When the stacked structure shown in FIG. 5 is formed, a material forming the first resin layer 501 is formed on one surface of a support substrate or the like by a coating method or the like, and then baked. Subsequently, a step performs the first inorganic insulating layer 502 and the second inorganic insulating layer 503 are each formed by a vapor deposition method such as a CVD method, and the materials constituting the second resin layer 504 are formed by a coating method or the like, followed by baking. Here, when the second resin layer 504 is fired, the first resin layer 501 is also heated at the same time, so that gas components are also desorbed from the first resin layer 501. However, since the first inorganic insulating layer 502 is already formed on the first resin layer 501, the desorbed gas components stay near the interface between the first resin layer 501 and the first inorganic insulating layer 502. Thus, the interface between the first resin layer 501 and the first inorganic insulating layer 502 may be separated. The desorption of the gas component occurs in a larger amount as the volume of the first resin layer 501 increases. Therefore, in the present embodiment, the desorption of gas components from the first resin layer 501 is reduced as much as possible by reducing the volume by reducing the thickness of the first resin layer 501.

The first resin layer 501 and the second resin layer 504 are baked at about 450° C. to 500° C., respectively, but are set so that the maximum value of the baking temperature of the second resin layer 504 does not exceed the maximum value of the baking temperature of the first resin layer 501. As described above, when the second resin layer 504 is fired, the first resin layer 501 is also heated at the same time. However, the desorption of gas components from the first resin layer 501 is small unless the maximum value of the baking temperature when the first resin layer 501 is fired in advance is reached. If the baking temperature of the first resin layer 501 exceeds the maximum value of the baking temperature of the first resin layer 501 during baking of the second resin layer 504, the first resin layer 501 has no heating history, so that new gas components are desorbed. The maximum value of the baking temperature of the second resin layer 504 is set so as not to exceed the maximum value of the baking temperature of the first resin layer 501. Thereby, the desorption of gas components from the first resin layer 501 during baking of the second resin layer 504 can be suppressed.

Figure 6A:
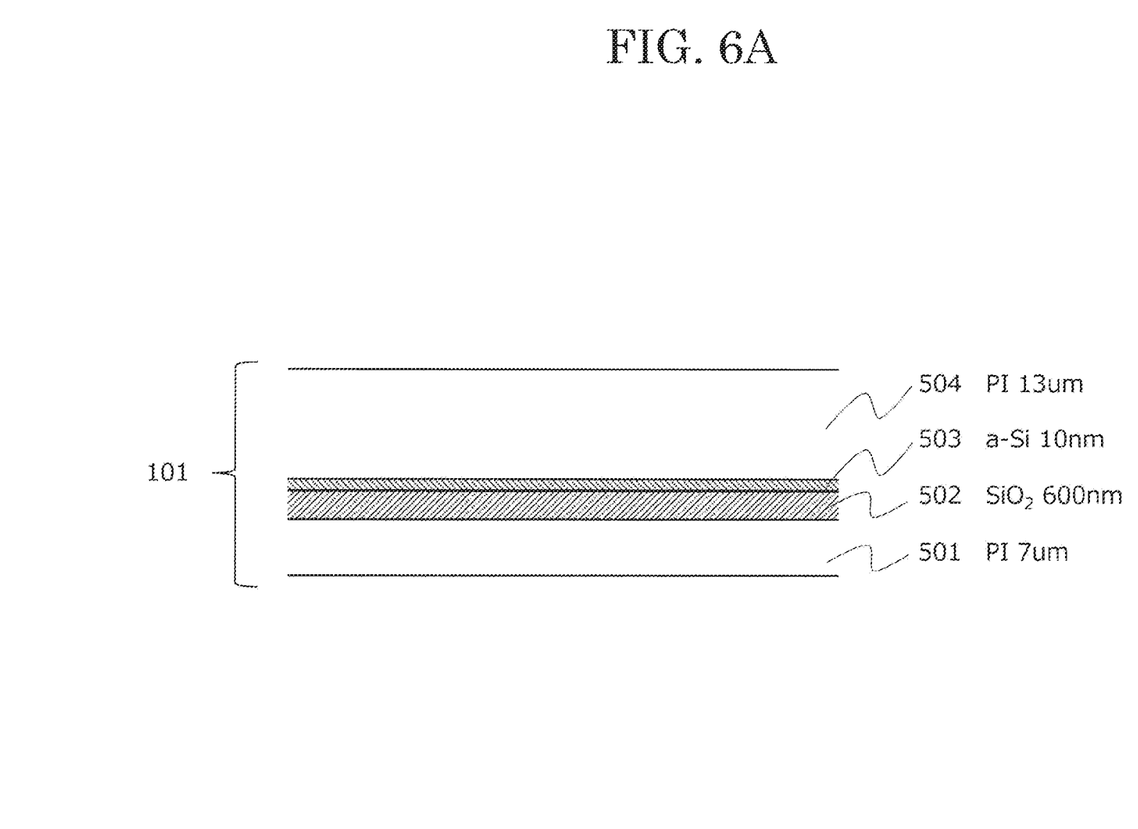
FIG. 6A is a cross-sectional view showing a display device according to an embodiment of the present invention.

Specific examples are described below. Polyimide is applied and formed on a supporting substrate, and then baked at a maximum temperature of 500° C. Thus, a polyimide layer having a thickness of 7 μm is obtained as the first resin layer 501. Next, a silicon oxide film is formed with a thickness of 600 nm by the CVD method as the first inorganic insulating layer 502, and an amorphous silicon film is formed with a thickness of 10 nm by the CVD method as the second inorganic insulating layer 503. Next, polyimide is applied and formed, and then baked at a maximum temperature of 480° C. As a result, a polyimide layer having a thickness of 13 μm is formed as the second resin layer 504. Through the above steps, the substrate 101 having flexibility is formed as shown in the FIG. 6A. According to the above-described steps, a favorable laminated structure can be obtained without the first inorganic insulating layer 502 being separated from the first resin layer 501 due to the gas released from the first resin layer 501 when the second resin layer 504 is fired.

Figure 6B:
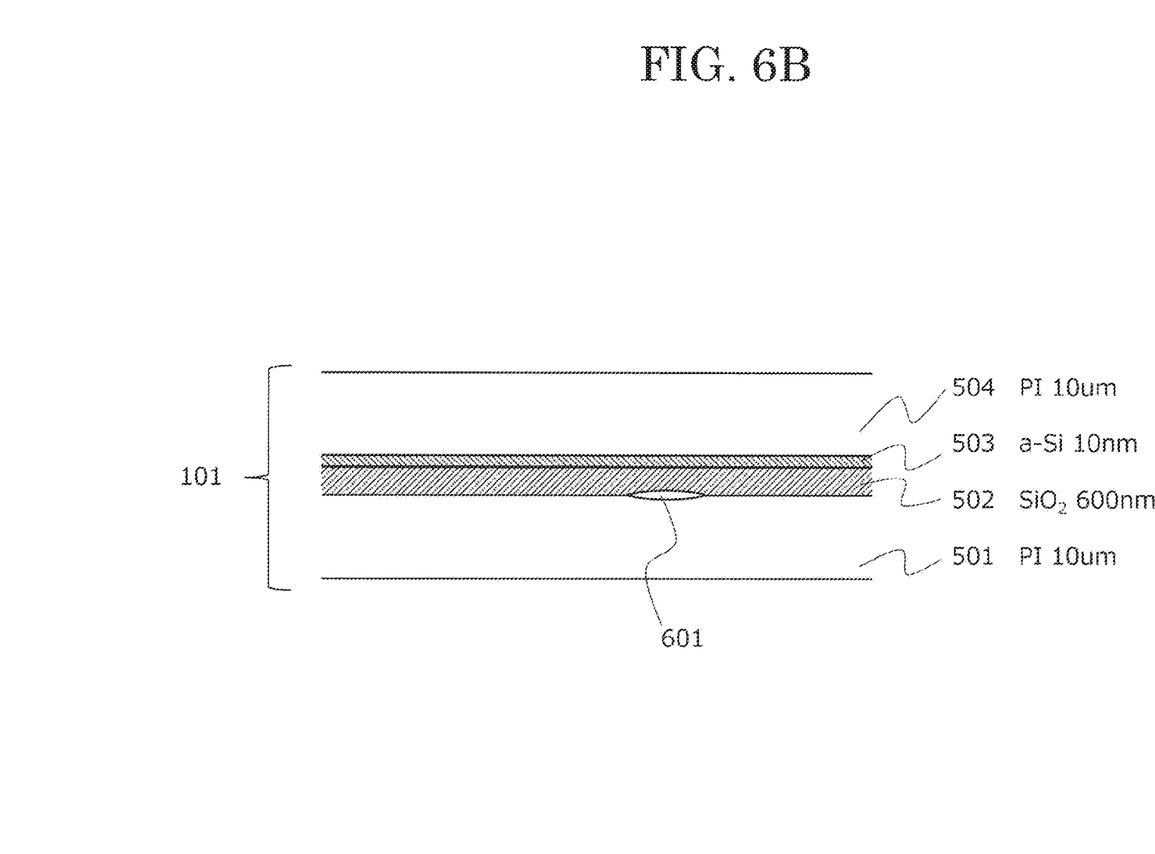
FIG. 6B is a cross-sectional view showing a comparative examples for the display device according to an embodiment.

On the other hand, as a comparative example, the first resin layer 501 and the second resin layer 504 were each formed of a polyimide layer having a thickness of 10 μm under the above-described conditions, as shown in FIG. 6B. Peeling 601 occurred between the first resin layer 501 and the first inorganic insulating layer 502.

Subsequently, examples of detailed structures of the display device 100 including the functional layer formed on the substrate will be described.

Figure 7:
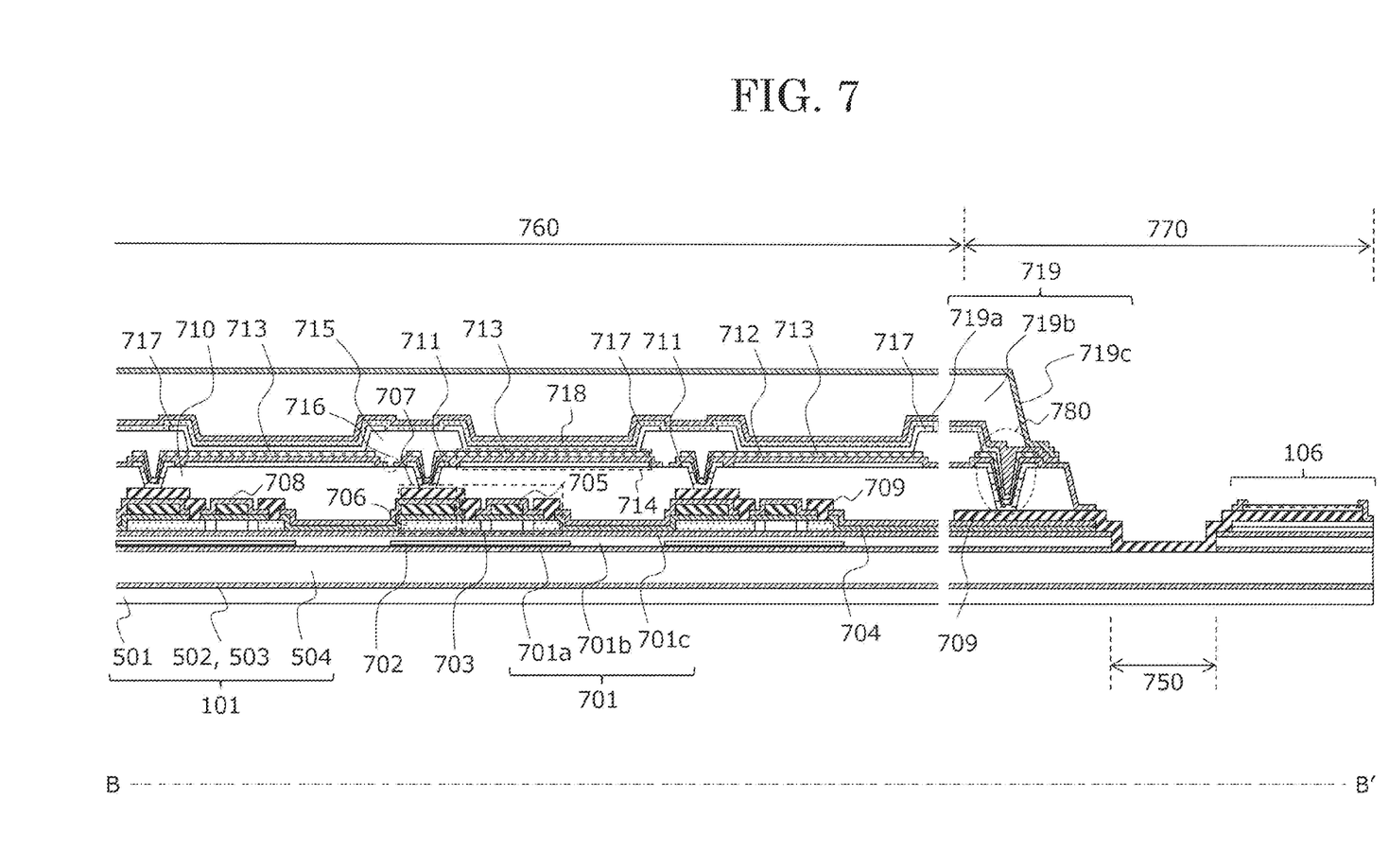
FIG. 7 is a cross-sectional view showing an embodiment of the display device and the manufacturing method of the present invention.

FIG. 7 schematically shows a cross-sectional structure taken along the line B-B' of the display device 100 in FIG. 1. Mainly, a display region including an N-channel thin film transistor included in a pixel, a terminal portion and a bending region for bending a frame region including the terminal portion are shown. The thin film transistor is also called "TFT". When the TFT is of an N-channel type, it is referred to as "Nch TFT", and when the TFT is of a P-channel type, it is referred to as "Pch TFT".

As described above, the three-layer stacked structure of a silicon oxide film 701a, a silicon nitride film 701b, and a silicon oxide film 701c is provided as an undercoat layer 701 on the substrate 101 having a stacked structure including the first resin layer 501, the first inorganic insulating layer 502, the second inorganic insulating layer 503, and the second resin layer 504. The lowermost silicon oxide film 701a is provided for improving the adhesion to the substrate 101. The middle silicon nitride film 701b is provided as a blocking film for moisture and impurities from the outside. The uppermost silicon oxide film 701c is provided as a blocking film for preventing hydrogen atoms contained in the silicon nitride film 701b from diffusing to a semiconductor layer side described later. In particular, it is not limited to this structure. On the substrate 101, there may be provided more layers, or a single layer or a two-layer layer may be provided.

At the time of the undercoat layer 701 is formed, a light shielding layer (Light Shield layer: LS layer) 702 may be formed in accordance with the position of forming the TFT later. The LS layer 702 can suppress a change in TFT characteristics due to intrusion of light from the back surface of the channel of the TFT. In the case where the LS layer 702 is formed using a conductive layer, a predetermined potential is applied to the LS layer 702, so that a TFT can have a back gate effect. After forming the silicon oxide film 701a, to form the LS layer 702 in an island shape in accordance with the position where the driving transistor (DRT) is formed. Thereafter, the silicon nitride film 701b and the silicon oxide film 701c are formed by stacked layer so as to encapsulate the LS layer 702 in the undercoat layer 701. One embodiment of the present invention is not limited thereto, and the LS layer 702 may be formed first on the substrate 101, and the undercoat layer 701 may be formed thereafter.

A TFT 703 is formed on the undercoat layer 701. Although, as the TFT 703, a polysilicon TFT is taken as an example and only an Nch TFT is shown, a Pch TFT may be formed simultaneously with an Nch TFT. The Nch TFT has a structure in which a low concentration impurity region is provided between a channel region and a source/drain region (high concentration impurity region). Usable as a gate insulating film 704 may be the silicon oxide film, and usable as a gate electrode 705 may be a MoW film (first wiring layer). The first wiring layer, in addition to the gate electrode 705 of the TFT 703, forms a storage capacitor line and is also used to form a storage capacitor (Cs) 707 with a polysilicon 706.

On the TFT 703, a silicon nitride film or a silicon oxide film is laminated as an interlayer insulating film 708. After that, patterning is performed on the interlayer insulating film 708 to form a contact hole reaching the polysilicon 706 and the like. At the same time, a portion of the interlayer insulating film 708 corresponding to a bending region 750 is removed. Further, since the undercoat layer 701 is exposed by removing the interlayer insulating film 708, the undercoat layer 701 is also removed by patterning. After removing the undercoat layer 701, the second resin layer 504 constituting the substrate 101 is exposed. Although not shown, the surfaces of the second resin layer 504 may be partially eroded through the etching of the undercoat layer 701 to cause a film reduction.

In addition, a conductive layer (second wiring layer) 709 to be a source/drain electrode and a lead wiring is formed. In this embodiment, a three-layer structure of Ti, Al, and Ti is adopted. A portion of the storage capacitor (Cs) 707 is formed of the interlayer insulating film 708, an electrode formed of the same conductive layer as the gate electrode 704 of the TFT 703, and an electrode formed of the same conductive layer as the source/drain wiring of the TFT 703. The lead wiring extends to the end part of the substrate perimeter and later forms the terminals 106 connecting a flexible printed substrate or a driver IC. The terminals 106 may be formed in the same layer as the first wiring layer forming the gate electrode 705.

A planarization film 710 is formed to cover the TFT 703 and the lead wiring. Usable as the planarization film may be organic materials such as photosensitive acrylics and polyimides. The above organic resin has excellent surface flatness as compared with an inorganic insulating material formed by CVD or the like.

The planarization film 710 is removed at a pixel contact portion and a portion of a peripheral region 770. The portion where the conductive layer 709 is exposed by removing the planarization film is once coated with a transparent conductive film 711. For example, usable as the transparent conductive film 711 may be an ITO (Indium tin oxide). The transparent conductive film 711 is once covered with a silicon nitride film 712, and then the pixel contact portion is opened again to form a conductive layer 713 to be a pixel electrode. Here, the pixel electrode is formed as a reflecting electrode and is a three-layer stacked structure of IZO, Ag, and IZO. In a pixel part, an additional capacitor 714 is formed by the transparent conductive film 711, the silicon nitride 712, and the conductive layer 713. On the other hand, the transparent conductive film 711 is also formed on the surface of the terminals 106. One object of the transparent conductive film on the terminals 106 is to provide as the barrier film so that the exposed portion of wirings is not damaged in the subsequent steps.

By the way, during the patterning of the pixel electrode (the conductive layer 713), the transparent conductive film 711 is partially exposed to etching environment. However, the transparent conductive film 711 is sufficiently resistant to etching of the conductive layer 713 due to an annealing treatment performed between the transparent conductive film 711 formation and the conductive layer 713 formation.

After the formation of the pixel electrode, an insulating layer called a bank (rib) 715 serving as a partition in the pixel region is formed. As the bank 715, an organic material such as photosensitive acrylic or polyimide is used like the planarization film 710. The bank 715 is preferably opening to expose the surface of the pixel electrode as a light emitting region and the opening edge is of a smooth tapered shape. If the edge of the opening is sharp, poor coverage of an organic layer to be formed later occurs.

The planarization film 710 and the bank 715 are contacted have a region in contact with each other through an opening 716 provided in the silicon nitride film 712. The region is an opening for drawing moisture and gases desorbed from the planarization film 710 through the bank 715 through heat treatment or the like after the bank is formed. Here, the desorbed moisture and gas are the same phenomena as the moisture and gas desorbed from the first resin layer 501 and the second resin layer 504 when the substrate 101 is formed. The release from the planarization film 710 to the bank 715 through the opening 716 can suppress separation of the interface between the planarization film 710 and the silicon nitride film 712.

After the bank 715 is formed, an organic layer 717 for forming an organic EL layer is stacked layer formed. Although a single layer is illustrated in FIG. 7, a hole transport layer, a light emitting layer, and an electron transport layer are sequentially stacked and form from the pixel electrode side. These layers may be formed by vapor deposition or may be formed by coating on a solvent dispersion. Further, as shown in FIG. 7, may be formed selectively for each pixel, or may be solid on the entire surface covering the display region. In the solid form, white light can be obtained at all pixel and the desired color wavelengths can be extracted by color filters (not shown).

After the organic layer 717 is formed, a counter electrode 718 is formed. Since the top emission structure is adopted, the counter electrode 718 needs to be optically transparent. The top emission structure refers to a structure in which light is emitted from the counter electrode 718 provided over the substrate 101 with an organic layer 717 interposed therebetween. As the counter electrode 718, an MgAg film is formed as a thin film to the extent that the emitted light from the organic EL layer transmits. According to the above-described order of formation of the organic layer 717, the pixel electrode side becomes the anode and the counter electrode side becomes the cathode. The counter electrode 718 is formed over a display region 760 and a cathode contact portion 780 provided near the display region. The counter electrode 718 is connected to the lower conductive layer 709 at the cathode contact portion 780, and is led out to the terminal 106.

After forming the counter electrode, a sealing layer 719 is formed. One of the functions of the sealing layer 719 is to prevent the previously formed organic layer from invading moisture from the outside, and a high gas barrier property is required for the sealing layer. Here, a stacked structure including a silicon nitride film 719*a*, an organic resin 719*b*, and a silicon nitride film 719*c* is shown as a stacked structure including a silicon nitride film as the sealing layer 719. Although not shown, an amorphous silicon layer may be provided between the silicon nitride film 719*a* and the organic resin 719b for the purpose of improving adhesion as described in the step of laminating the substrate 101.

Figure 8:
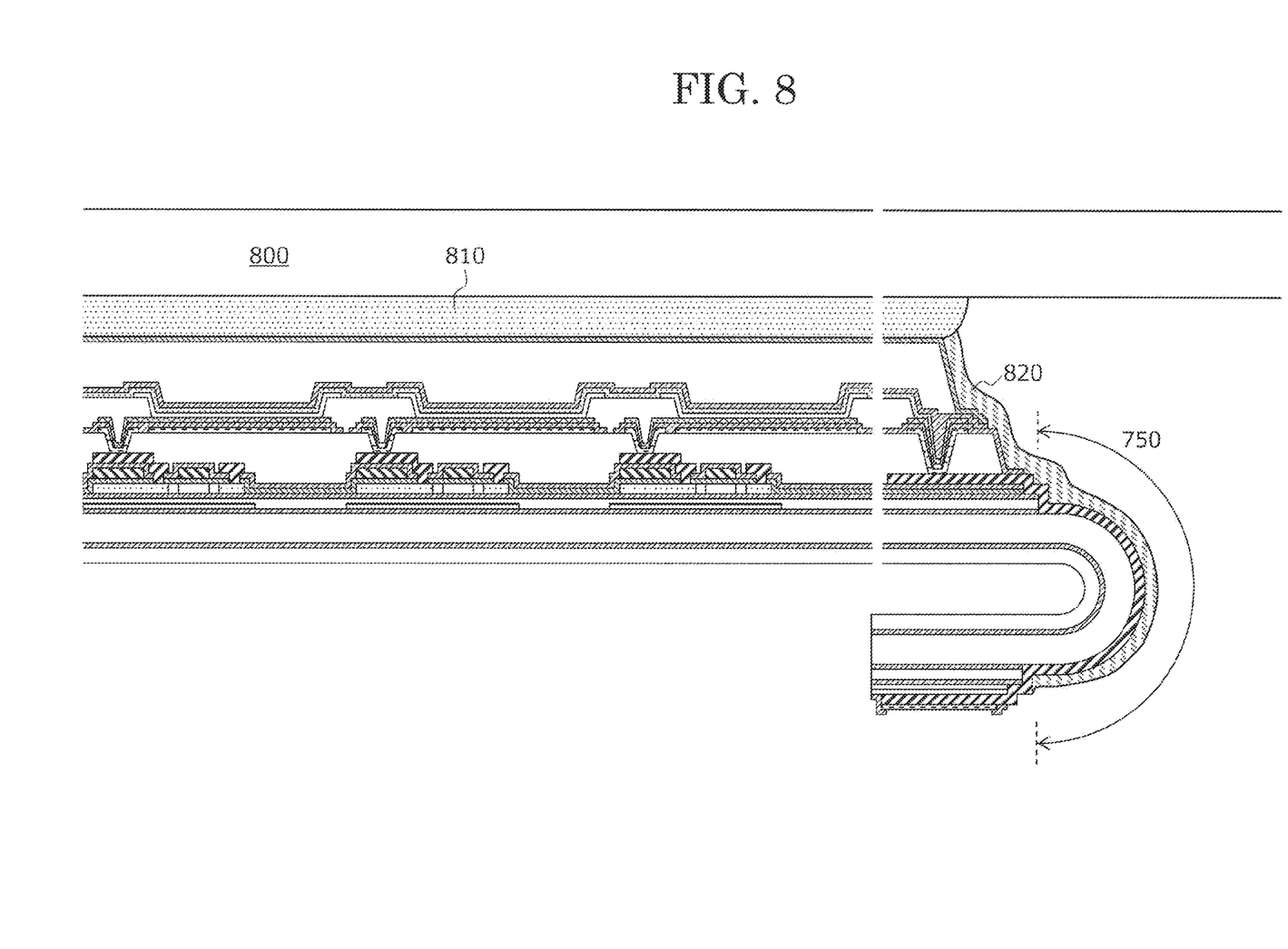
FIG. 8 is a cross-sectional view showing an embodiment of the display device and the manufacturing method of the present invention.

Through the above steps, the display device 100 is manufactured. If necessary, a cover glass 800 may be provided on the sealing layer 719, as shown in FIG. 8. A touch sensor or the like may be formed in the cover glass 800. In this case, a filler 810 using resins or the like may be interposed to fill the gap between the display device 100 and the cover glass 800.

When the substrate 101 is bent, cracks easily occur, particularly since the inorganic insulating layer and the like have poor toughness. Therefore, in the bending region 750, the inorganic insulating layer is removed. To secure the strength of the region, a resin coat 820 or the like may be provided over the conductive layer 709 to cover the bending region 750.

According to the display device shown in the present embodiment, by configuring the substrate 101 so that the thickness of the second resin layer is larger than the thickness of the first resin layer, the desorption of the gas components from the first resin layer is minimized. The maximum value of the temperature of the second resin layer 504 at the time of the heat treatment is set so as not to exceed the maximum value of the temperature of the first resin layer 501 at the time of the heat treatment. In this manner, desorption of the gas components from the first resin layer 501 during baking of the second resin layer 504 can be suppressed. As a result, peeling at the interface between the first resin layer 501 and the first inorganic insulating layer 502 can be suppressed.

The substrate 101 provided the first inorganic insulating layer 502 between the first resin layer 501 and the second resin layer 502. By providing the first inorganic insulating layer 502, moisture or other contaminants can be prevented from entering the functional layer 505 through the first resin layer 501 and the second resin layer 504. The second inorganic insulating layer 503 is provided between the first resin layer 501 and the first inorganic insulating layer 502, or between the first inorganic insulating layer 502 and the second resin layer 504. As a result, the adhesion between the first resin layer 501 and the first inorganic insulating layer 502, or between the first inorganic insulating layer 502 and the second resin layer 504 can be improved.

Second Embodiment

The configuration of the display device, which is another embodiment of the present invention, will be described below.

Figure 9:
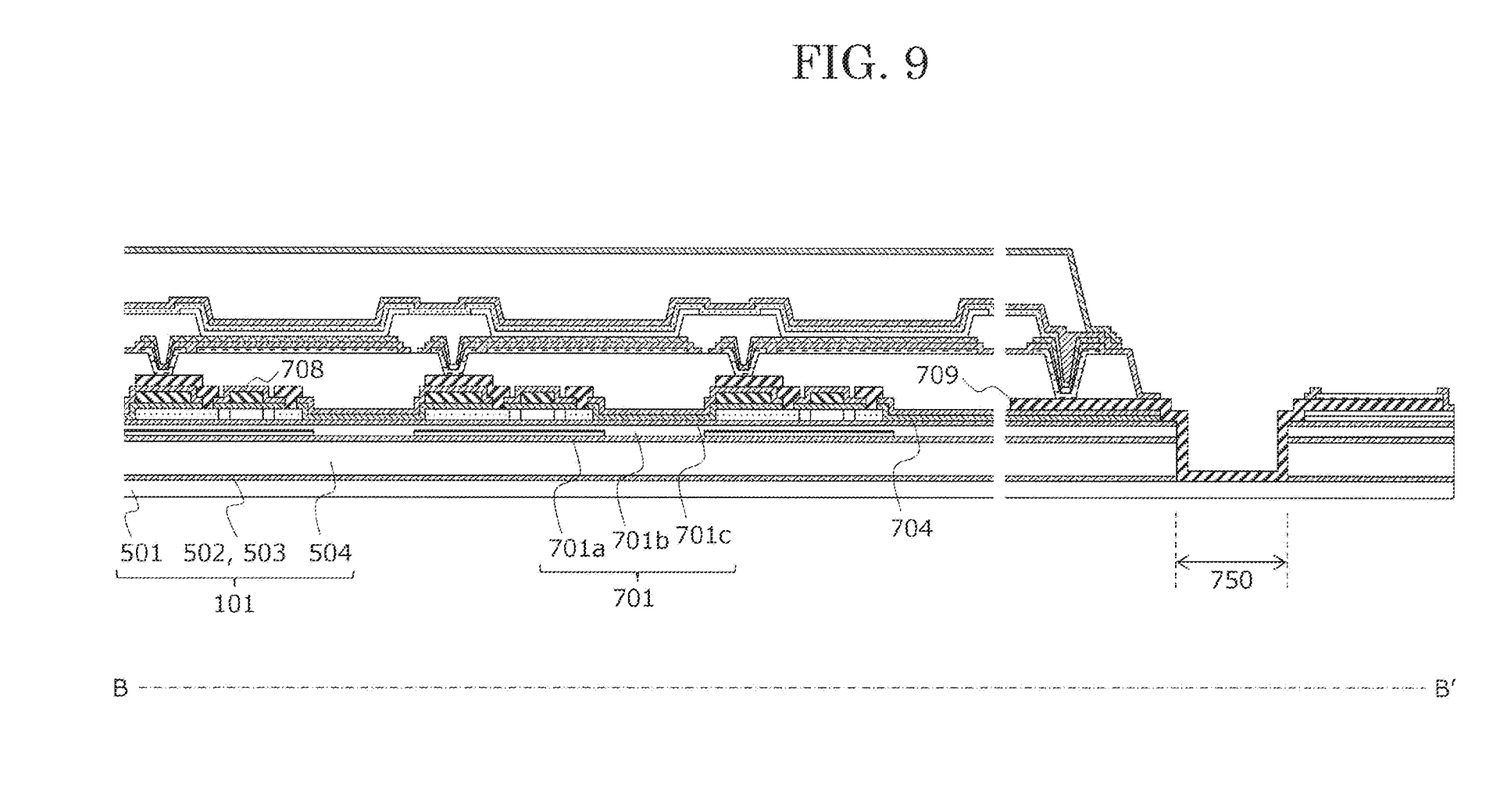
FIG. 9 is a cross-sectional view showing an embodiment of the display device and the manufacturing method of the present invention.

In FIG. 7, a region from which the inorganic insulating layers (the undercoat layer 701, the gate insulating film 704, and the interlayer insulating film 708) provided above the substrate 101 are removed is provided in the bending region 750. The first inorganic insulating layer 502 and the second inorganic insulating layer 503 provided between the first resin layer 501 and the second resin layer 504 extend to the bending region 750. As shown in FIG. 9, after removing the interlayer insulating film 708 and the undercoat layer 701, the second resin layer 504, the second inorganic insulating layer 503, and the first inorganic insulating layer 502 may be successively removed. As a result, the bending region 750 can be configured such that the inorganic insulating layer does not extend. The conductive layer 709 is provided so as to be in contact with the first resin layer 501. In the display device according to one embodiment of the present invention, the first resin layer 501 has a smaller film thickness than the second resin layer 504. Therefore, the bending region 750 from which the second resin layer 504 has been removed may be low mechanical strength. Therefore, as shown in FIG. 8, providing the resin coat 820 in the bending region 750 is very effective.

According to the structure of the display device described in this embodiment, the substrate 101 can be favorably bent by using a structure in which the inorganic insulating layer does not extend in the bending region 750. In addition, by providing the resin coat 820 after bending the substrate 101 in the bending region 750, the mechanical strength in the bending region 750 can be improved. Thus, the display device which can maintain high reliability even when the substrate 101 is curved or bent can be provided.

Third Embodiment

Figure 10A:
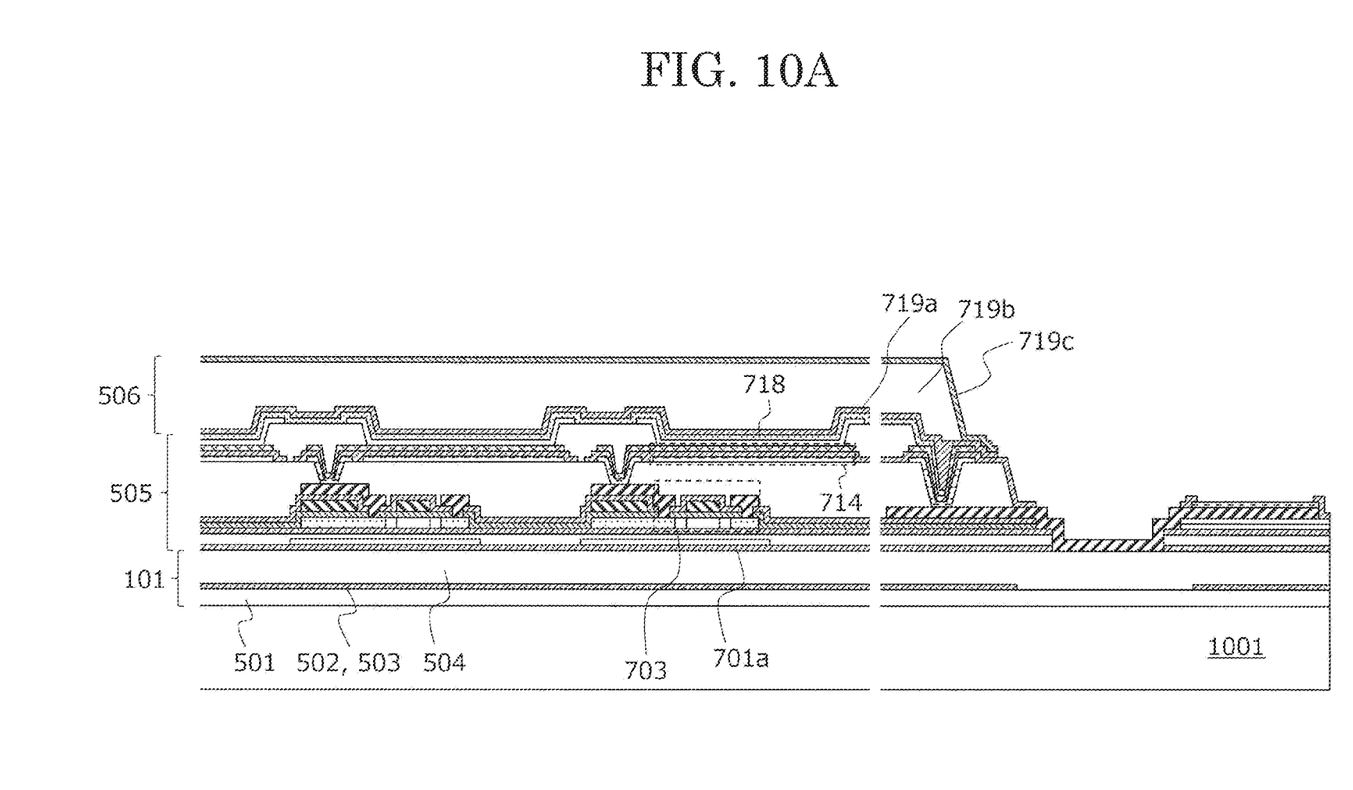
FIG. 10A is a cross-sectional view showing an embodiment of the display device and the manufacturing method of the present invention.

When the substrate 101 is made of a material having flexibility, it is difficult for the substrate 101 to maintain its flatness through the processes described with reference to FIGS. 7 to 9. Therefore, when such a display device is formed, as shown in FIG. 10A, a first resin layer 501, a first inorganic insulating layer 502, and a second inorganic insulating layer are formed on a supporting substrate 1001 made of glass, quartz, or the like. Subsequently, the functional layer 505 including the plurality of pixels or the gate drive circuit formed using the conductive layer, the semiconductor layer, or the insulating layer is formed. Thereafter, the sealing layer 506 including the silicon nitride film 719a, the organic resin 719b, the silicon nitride film 719c is formed. Through a series of steps, the flatness on the substrate 101 is maintained by the supporting substrate 1001, so that manufacturing steps including high-precision photolithography can be completed normally. It should be noted that the first embodiment may be referred to for the detail of the methods of forming the substrate 101 to the sealing layer 506.

Figure 10B:
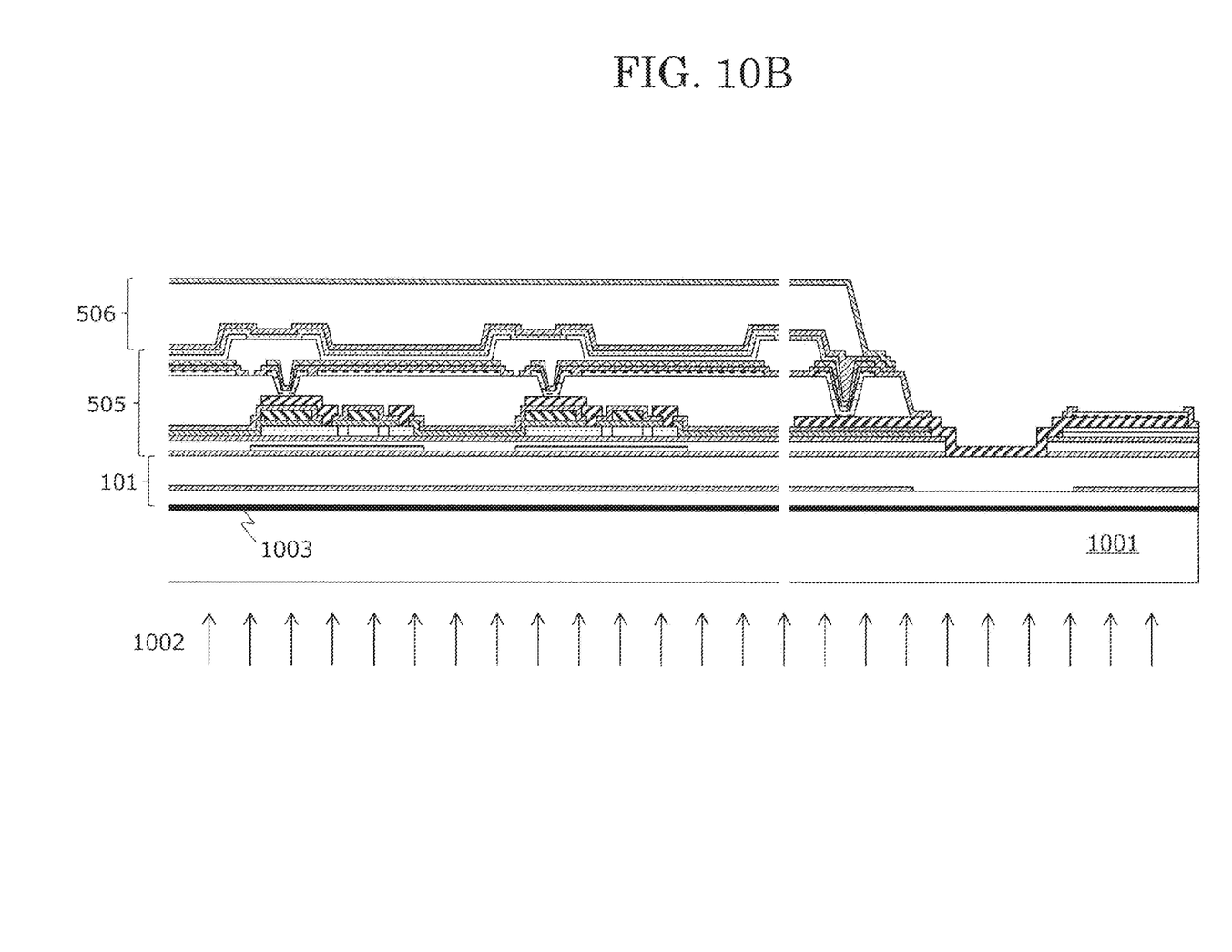
FIG. 10B is a cross-sectional view showing an embodiment of the display device and the manufacturing method of the present invention.
Figure 10C:
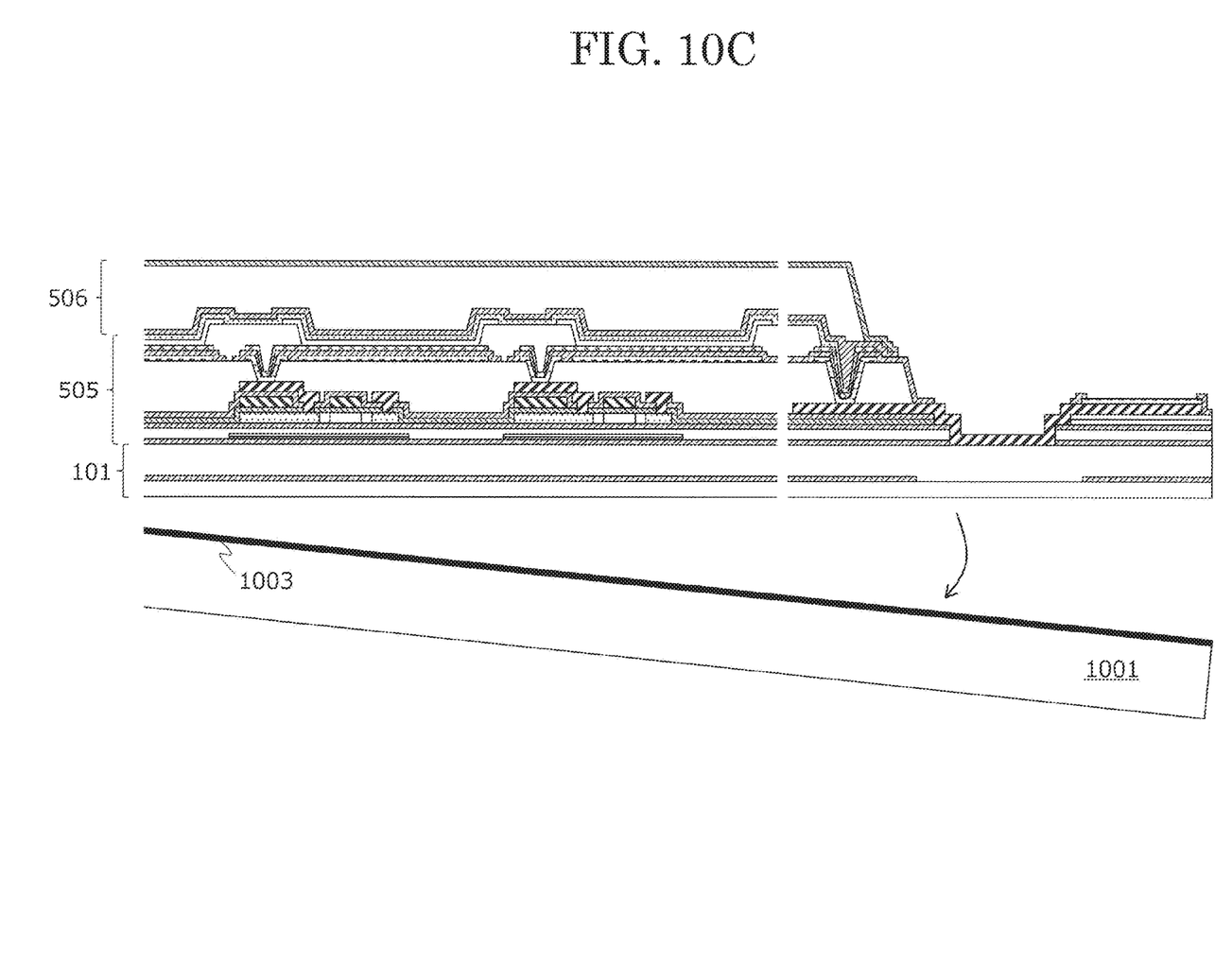
FIG. 10C is a cross-sectional view showing an embodiment of the display device and the manufacturing method of the present invention.

Subsequently, as shown in FIG. 10B, a laser irradiation treatment 1002 or the like is performed from the surface side where the substrate 101 is not formed of the support substrate 1001. Due to the laser irradiation treatment 1002, a part 1003 of the first resin layer 501 of the substrate 101 which is in contact with the supporting substrate 1001 is deteriorated, so that the adhesion is reduced. To decrease in adhesion is caused by thermal ablation or shrinkage of the first resin layer 501.

After that, as shown in FIG. 10O, the support substrate 1001 and the substrate 101 are physically separated from each other, so that the support substrate 1001 and the substrate 101 are separated from each other. The display device 100 peeled off from the support substrate 1001 can take a form as shown in FIGS. 2 to 4 depending on the flexibility of the substrate 101 at this point.

According to the manufacturing method of the display device shown in this embodiment, since the flatness on the substrate 101 having a flexibility is maintained, it is possible to perform the high-precision photolithography. The semiconductor layer, the insulating layer, and the conductive layer can be processed with high precision.

Within the scope of the concept of the present invention, those skilled in the art can conceive various changes and modifications, and it is understood that these changes and modifications also belong to the scope of the present invention. For example, as long as the gist of the present invention is provided, a person skilled in the art who adds, deletes, or changes the design of components, or adds, omits, or changes the conditions of processes to each of the above-described embodiments is included in the scope of the present invention.

What is claimed is:

1. A manufacturing method of display device, comprising steps of:
forming a substrate having a first resin layer, a first inorganic insulating layer provided on the first resin layer, and a second resin layer provided on the first inorganic insulating layer on a support substrate;
forming a functional layer includes a thin film transistor, a third resin layer or a third inorganic insulating layer covering the thin film transistor, a pixel electrode provided on the third resin layer or the third inorganic insulating layer and electrically connected to the thin film transistor, a bank covering an end of the pixel electrode and exposing a part of the upper surface of the pixel electrode, an organic layer covering a part of the upper surface of the exposed pixel electrode, and a counter electrode covering the organic layer and the bank;
forming a sealing layer covering the counter electrode, the sealing layer Including a fourth inorganic insulating layer; and
peeling the support substrate from the substrate, wherein
the second resin layer is formed to have a thickness greater than a thickness of the first resin layer,
performing a first heat treatment after forming the first resin layer and before forming the first inorganic insulating layer,
performing a second heat treatment after forming the second resin layer, and
a maximum temperature during the second heat treatment is lower than a maximum temperature during the first heat treatment.

2. The method according to claim 1, wherein
the thickness of the first resin layer is 70% or less of the thickness of the second resin layer.

3. The method according to claim 1, further comprising:
forming a second inorganic insulating layer between the first resin layer and the first inorganic insulating layer or between the first inorganic insulating layer and the second resin layer.

4. The method according to claim 1, wherein
the first inorganic insulating layer includes a silicon nitride.

5. The method according to claim 3, wherein
the second inorganic insulating layer includes a silicon oxide or amorphous silicon.

6. The method according to claim 1, wherein
the display device includes a display region in which a plurality of pixels is provided on substrate, a terminal adjacent to the display region, and a bending region between the display region and the terminal,
the method further comprising:
removing the second resin layer and the first inorganic insulating layer in a region overlapping with the bending region.

7. The method according to claim 5, wherein
the display device includes a display region in which a plurality of pixels is provided on substrate, a terminal adjacent to the display region, and a bending region between the display region and the terminal,
the method further comprising:
removing the second resin layer, the first inorganic insulating layer, and the second inorganic insulating layer in a region overlapping with the bending region.

* * * * *